United States Patent [19]
Furumiya

[11] Patent Number: 5,858,812
[45] Date of Patent: Jan. 12, 1999

[54] METHOD FOR FABRICATING INTERLINE-TRANSFER CCD IMAGE SENSOR

[75] Inventor: Masayuki Furumiya, Tokyo, Japan

[73] Assignee: NEC Corporation, Tokyo, Japan

[21] Appl. No.: 804,108

[22] Filed: Feb. 20, 1997

Related U.S. Application Data

[62] Division of Ser. No. 604,486, Feb. 21, 1996, Pat. No. 5,637,893.

[30] Foreign Application Priority Data

Feb. 21, 1995 [JP] Japan .................................... 7-032171

[51] Int. Cl.$^6$ ................................................. H01L 21/339
[52] U.S. Cl. ............................................. 438/76; 438/146
[58] Field of Search ................................ 438/60, 75, 76, 438/78, 144, 146

[56] References Cited

U.S. PATENT DOCUMENTS

| | | | |
|---|---|---|---|
| 4,435,897 | 3/1984 | Kuroda et al. | 438/76 |
| 4,831,426 | 5/1989 | Kimata et al. | 438/75 |
| 4,851,890 | 7/1989 | Miyatake | 438/76 |
| 5,288,656 | 2/1994 | Kusaka et al. | 438/78 |

OTHER PUBLICATIONS

N. Mutoh et al., "A ¼ inch 380K Pixel IT–CCD Image Sensor Employing Gate–Assisted Punchthrough Read–Out Mode", *IEDM 93*, pp. 563–566, 1993.

Primary Examiner—Chandra Chaudhari
Attorney, Agent, or Firm—Sughrue, Mion, Zinn, Macpeak & Seas, PLLC

[57] ABSTRACT

A solid-state image sensor has a photodiode region, a vertical CCD register for transferring a charge received at the photodiode region, a read-out gate region for reading the charge out to the vertical CCD register, and an element isolation region for isolating the photodiode region and the vertical CCD register. Ion-implantation is carried out first for the element isolation region and, thereafter, the photodiode region and the vertical CCD register are formed. The element isolation region is in a two layer configuration having a P$^+$-type region and a P-type region, and the P-type region is formed simultaneously with other regions including the read-out gate region. When the P-type region for the element isolation region is formed by ion-implantation before the formation of the photodiode region and the vertical CCD register, the fine patterning of the resist mask becomes unnecessary.

3 Claims, 9 Drawing Sheets

1

METHOD FOR FABRICATING INTERLINE-TRANSFER CCD IMAGE SENSOR

This is a divisional of application Ser. No. 08/604,486 filed Feb. 21, 1996 and now U.S. Pat. No. 5,637,893.

BACKGROUND OF THE INVENTION (1) Field of the Invention

The present invention relates to a solid-state image sensor and a method for its fabrication, and more particularly to an interline-transfer CCD image sensor and its fabrication method.

(2) Description of the Related Art

In order to assist the understanding of the invention, a conventional interline-transfer CCD image sensor of the kind to which the present invention relates is first explained. As diagrammatically shown by a block diagram in FIG. 3, such a conventional image sensor is constituted by an image region 1, a horizontal CCD register 2, and a charge detection section (an output section) 3. A plurality of unit pixels are arranged in a matrix form in the image region 1. Each unit pixel 4 consists of a vertical CCD register 5, a photodiode 6, a read-out gate 7 for reading out a signal charge to the vertical CCD register 5 from the photodiode 6, and an element isolation region 8 outside the region of the pixel. The charge detection section 3 is provided at the left-hand end of the horizontal CCD register 2 in the image region 1.

In the unit pixel 4, as shown by a plan view in FIG. 1A and by a sectional view in FIG. 1B with the section taken along line 1B—1B in FIG. 1A, there are a P-type well 10 formed at a main surface side of an N-type silicon substrate 9 and an N-type region 13 formed in the well 10 and constituting the photodiode. In the well 10, there are also formed a P-type well 14 constituting the vertical CCD register and an N-type buried channel layer 15 on a surface of the P-type well 14. A $P^+$-type region 16a is formed on a surface of the element isolation region 8 and a $P^+$-type surface layer 17 for the reduction of noise is formed on a surface of the N-type region 13.

With the recent demand for miniaturization of CCD image sensors, a pixel size is being increasingly reduced. For example, in a ¼ inch format 380k pixel CCD of an NTSC type, the pixel size is as small as 4.8 $\mu$m(H)×5.6 $\mu$m(V) and, in a ⅔ inch format 2M pixel CCD, the pixel size is as small as 5.0 $\mu$m(H)×5.0 $\mu$m(V). However, as the size of the pixel is reduced, the area of the photodiode is also reduced, thus inevitably leading to a decrease in sensitivity. In order to enhance the photoelectric conversion efficiency per unit area, it is effective to arrange that the PN junction of the photodiode be positioned at a deep location in the substrate. In order to realize this, it is known to arrange that the P-type well layer 10 and the N-type region 13 constituting the photodiode be formed at a deep location by a high energy ion-implantation process.

A conventional method for fabricating the structure described above is explained with reference to FIGS. 2A, 2B and 2C. For the fabrication of the structure shown in FIG. 2A, the well 10 having an impurity concentration of about $5.0 \times 10^{14}$ cm$^{-3}$ to $5.0 \times 10^{15}$ cm$^{-3}$ is formed, using a mask 12, on the N-type silicon substrate 9 by ion-implantation of boron at a high energy of 1–2 MeV. Next, as shown in FIG. 2B, the N-type region 13 having an impurity concentration of about $1.0 \times 10^{16}$ cm$^{-3}$ to $1.0 \times 10^{17}$ cm$^{-3}$ is formed by ion-implantation of phosphorus at a high energy of 400–500 keV followed by activation. Also, the well layer 14 and the buried channel layer 15 are formed by respective ion-implantations. Thereafter, the element isolation region is formed by ion-implanting twice as will now be explained. First, a thin resist film 19 having an opening 18 with a width of 0.6 $\mu$m and having a thickness of about 1 $\mu$m is formed. The P-type region 16 having an impurity concentration of about $1.0 \times 10^{17}$ cm$^{-3}$ to $1.0 \times 10^{18}$ cm$^{-3}$ is formed by ion-implantation of boron at a high energy of about 20 keV followed by activation. As shown in FIG. 2C, a thick resist film 21 with a thickness of about 2 $\mu$m having an opening 20 with a width of 0.6 $\mu$m is formed and, by ion-implantation of boron at an energy of 100–200 KeV and subsequent activation, a P-type region 22 having an impurity concentration of about $5.0 \times 10^{15}$ cm$^{-3}$ to $5.0 \times 10^{16}$ cm$^{-3}$ is formed in a region having a depth of 0.2 $\mu$m to 1.0 $\mu$m. In this way, the formation of the element isolation region 8 constituted by the P-type region 22 and the $P^+$-type region 16a is completed.

Now, the reason that the two separate ion-implantations are carried out for the formation of the element isolation region is explained. FIG. 4 shows a first-order impurity concentration distribution in the depth direction of the substrate at the element isolation region 8. The depth from the surface of the substrate is given in the axis of abscissas and the impurity concentration is given in the axis of ordinate. The P-type well 10 is formed by high energy ion-implantation so that the peak of the impurity concentration exists at a deep position of the substrate. On the other hand, since the $P^+$-type region 16a is formed by low energy ion-implantation, the peak of the impurity concentration exists near the surface of the substrate. Therefore, where the element isolation region is formed only by the $P^+$-type region 16a, the P-type impurity concentration becomes extremely low in the vicinity of the depth D shown in FIG. 4. For this reason, the P-type region 22 whose peak of the impurity concentration exists in the vicinity of the depth D is formed by the high energy ion-implantation as used in the formation of the $P^+$-type region 16a. This ensures the function of element isolation.

As explained above, in order to form the $P^+$-type region 16a by utilizing a 20 keV ion-implantation, a 1 $\mu$m thick resist film 19 may serve as a mask. However, the P-type region 22 is formed by a 100–200 keV ion-implantation so that it is necessary to use the resist film 21 with a thickness of about 2 $\mu$m for it to be used as a mask. This is the reason that the resist film formation process is required to be carried out in two steps, and this leads to a problem in increasing the fabrication steps and cost. Also, with the resist film having a thickness of about 2 $\mu$m, the limit in the present-day technology is to open a space of about 0.6 $\mu$m and it is difficult to narrow the space any further. Also, as shown in FIG. 5A, where the ions are implanted with a tilt angle of 7° being provided in order to prevent the channeling, the bottom surface is shadowed only by about 0.1 $\mu$m in the case of the 1 $\mu$m thick resist film. However, as shown in FIG. 5B, in the case of the space between the 2 $\mu$m thick resist films, the bottom surface is shadowed by about 0.35 $\mu$m, which means that more than half of the ion-implantation width of 0.6 $\mu$m is shadowed, thus making it impossible to carry out a satisfactory ion-implantation. Thus, any further ultra-fine patterning is impossible.

SUMMARY OF THE INVENTION

An object of the invention, therefore, is to overcome the problems existing in the prior art and to provide a solid-state image sensor whose pixel has been scaled-down, and a method for fabricating the same.

Another object of the invention is to provide an element isolation region which contributes to the size reduction of the image sensor.

According to one aspect of the invention, there is provided a solid-state image sensor having
a pixel which comprises:
a photodiode region constituted by a first first-conductivity type region which is disposed in a second second-conductivity type region and which has a depth deeper than the second second-conductivity type region, and a second-conductivity type surface layer which is disposed on a surface portion of the first first-conductivity type region;
a vertical CCD register including a second second-conductivity type well which is spaced from but adjacent to the photodiode region and which is disposed in the second second-conductivity type region and has a depth deeper and an impurity concentration higher than that of the second second-conductivity type region, and a buried channel layer constituted by a second first-conductivity type region which is disposed on a surface portion of the second second-conductivity type well and which has a depth shallower than that of the first first-conductivity type region;
a read-out gate region constituted by a portion of the second second-conductivity type region interposed between the photodiode region and the buried channel layer; and
a second-conductivity type element isolation region insulating the first first-conductivity type region and the buried channel layer; and the solid-state image sensor comprising:
a first well which is constituted, together with the second second-conductivity type region, by a first second-conductivity type region which is disposed on a surface portion of a first-conductivity type semiconductor substrate, and the second second-conductivity type region being disposed on a surface portion of the first second-conductivity type region and having an impurity concentration higher than that of the surface portion of the first second-conductivity type region; and
a third second-conductivity type region which is formed by the second-conductivity type element isolation region on a surface of the second second-conductivity type region and which has an impurity concentration higher than that of the second second-conductivity type region.

According to another aspect of the invention, there is provided a solid-state image sensor comprising:
a first well constituted by a second-conductivity type region which is formed in a surface portion of a first-conductivity type semiconductor substrate;
a pixel which includes
a photodiode region constituted by a first first-conductivity type region which is formed in the second-conductivity type region, and a second-conductivity type surface layer which is formed in a surface portion of the first first-conductivity type region;
a vertical CCD register including a second second-conductivity type well which is spaced from but adjacent to the photodiode region and which is disposed in a surface portion of the second-conductivity type region and has an impurity concentration higher than that of the second-conductivity type region, and a buried channel layer which is disposed in a surface portion of the second second-conductivity type well and has a depth shallower than the first first-conductivity type region;
a read-out gate region constituted by a portion of the second-conductivity type region interposed between the photodiode region and the buried channel layer; and
a second-conductivity type element isolation region insulating the first first-conductivity type region and the buried channel layer; and
a high impurity concentration second-conductivity type region which is formed by the second-conductivity type element isolation region on a surface of the second second-conductivity type well.

In the conventional solid-state image sensor, apart from a surface portion (normally a threshold control layer is provided) of the read-out gate region 26, it is well known that, for the reasons that the P-type well 10 has a profile as shown in FIG. 4, the element isolation region 8 is provided with the P-type surface layer 16, and the N-type region 13 is formed at a deep position in order to increase sensitivity, the signal charge which is read-out at the buried channel layer 14 passes through the inside of the substrate and thus it is required to apply a high voltage to the read-out/transfer gate electrode 25.

In the solid-state image sensor of the first aspect of the invention, the read-out gate region is a region which has a higher impurity concentration within the second second-conductivity type region so that the current path within the substrate is formed more close to a surface side of the substrate. Also, for forming the element isolation region, since the underlying second second-conductivity type region is a part of the first well which extends over a wide area, the impurity concentration at the element isolation region can be made uniform, thus eliminating a problem which is caused by the use of a conventional thick resist film and which stands as an obstacle in enhancing the miniaturization (due to a minimum processing dimension limit).

In the prior art, the impurity concentration at the element isolation region becomes lower at a photodiode region and a vertical CCD register side so that the smear is apt to occur. In the solid-state image sensor according to the second aspect of the invention, however, the second well of the vertical CCD register is in common with a part of the element isolation region so that there is no possibility for the concentration of the low impurity concentration region of the element isolation region to become low at its vertical CCD register side. Also, the arrangement eliminates a problem as caused by the use of a thick resist film in the prior art example.

In both the image sensors according to the first and the second aspect of the invention, the resist film formation step of only once may be sufficient for the formation of the element isolation region.

In the solid-state image sensor according to the invention, since the low impurity concentration region of the element isolation region is formed simultaneously with the first first-conductivity type region (as in the structure according to the first aspect of the invention) or with the second well (as in the structure according to the second aspect of the invention) under the lower part of the vertical CCD register, the ion-implantation may be carried out only one time for the formation of the element isolation region, thus simplifying the fabrication process and reducing the manufacturing cost. Also, during the formation of the size of the first first-conductivity type region or the second well, its size is wider than that of the element isolation region so that the patterning thereof does not need to take into account the minimum processing size limitation, thus enabling the further size reduction of elements.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Figure 6A:
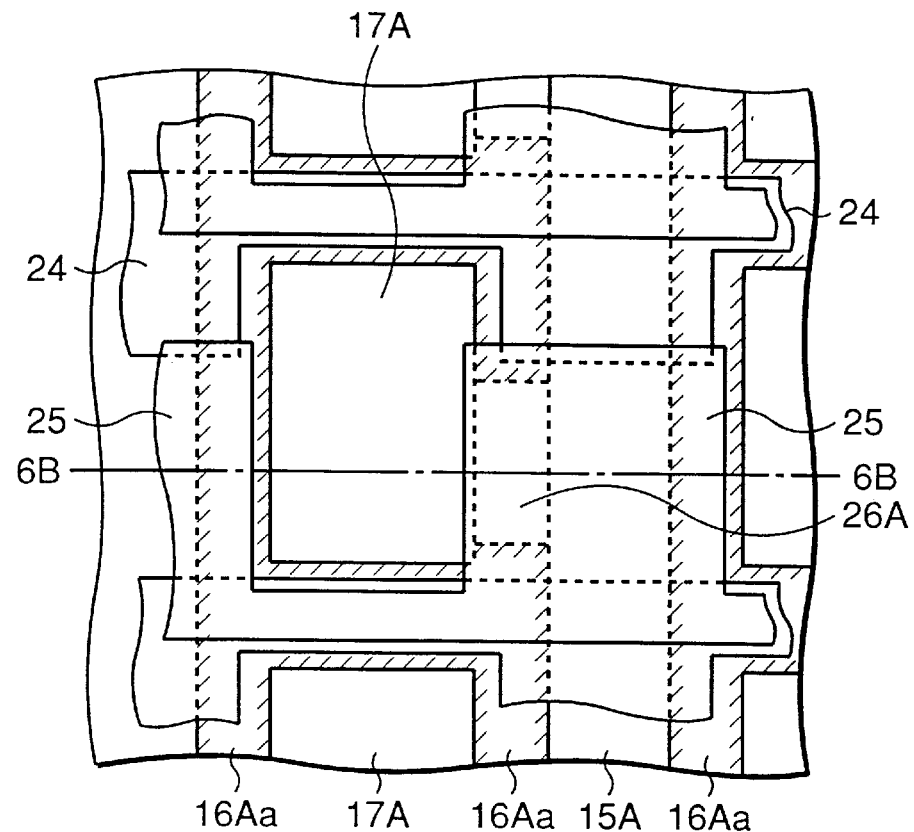
FIG. 6A is a plan view showing a solid-state image sensor of a first embodiment according to the invention (first aspect of the invention)
Figure 6B:
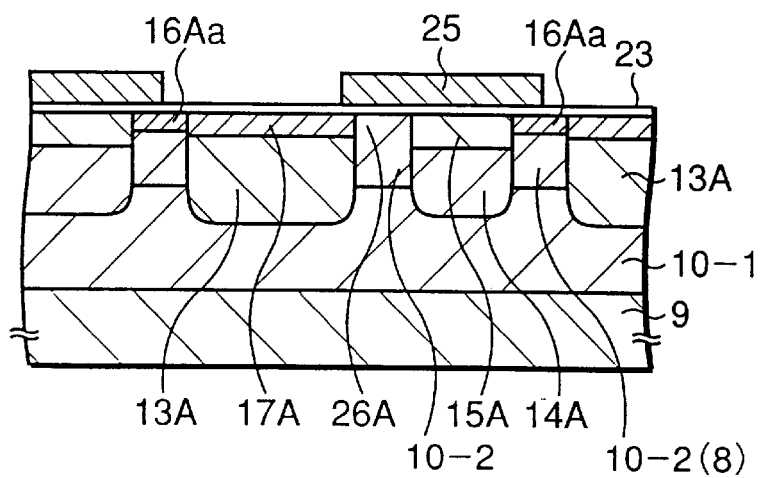
FIG. 6B is a sectional view of the same with the section taken along line 6B—6B in FIG. 6A.

Now, the solid-state image sensor of the first aspect of the invention as a first embodiment is explained with reference to FIGS. 6A and 6B. The solid-state image sensor is composed of a first well and a pixel. The first well is constituted by a first P-type region 10-1 which is disposed on a surface portion of an N-type semiconductor substrate 9 and a second P-type region 10-2 which is disposed on a surface portion of the first P-type region and has an impurity concentration higher than that of the surface portion of the first P-type region. The pixel includes a photodiode region constituted by a first N-type region 13A which is provided in the second P-type region 10-2 so as to have a depth deeper than the second P-type region and a P$^+$-type surface layer 17A which is formed on a surface portion of the first N-type region 13A; a vertical CCD register which includes a P-type second well 14A that is spaced from but adjacent to the photodiode region, that is formed in the second P-type region 10-2 and that has a depth deeper than and an impurity concentration higher than that of the second P-type region 10-2, and a buried channel layer that is formed in a surface portion of the second well layer 14A and that is formed by a second N-type region 15A having a depth shallower than that of the first N-type region 13A; a read-out gate region 26A constituted by the semiconductor substrate region interposed between the photodiode region and the buried channel layer 15A; and a second P-type element isolation region 8 which insulates the first N-type region 13A and the buried channel layer 15A. Further, there is provided a third P-type region (P$^+$-type region 16A$a$) which is formed in the P-type element isolation region 8 on a surface of the second P-type region 10-2 and which has an impurity concentration higher than that of the second P-type region 10-2.

A method for fabricating the solid-state image sensor of the first embodiment is now explained.

Figure 7A:
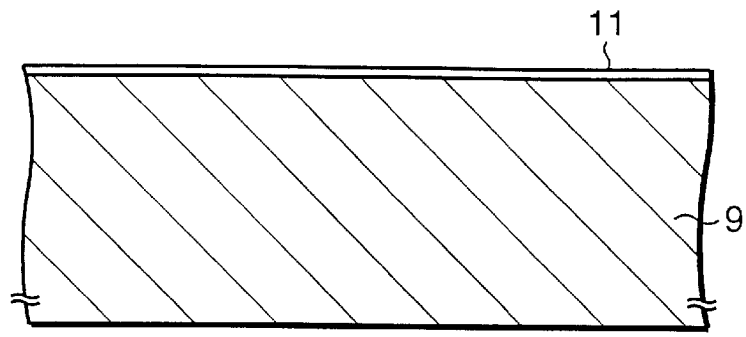
FIGS. 7A–7C are sectional views of the image sensor of the first embodiment for use in explaining sequential steps of a method for fabricating the same according to the invention.
Figure 7B:
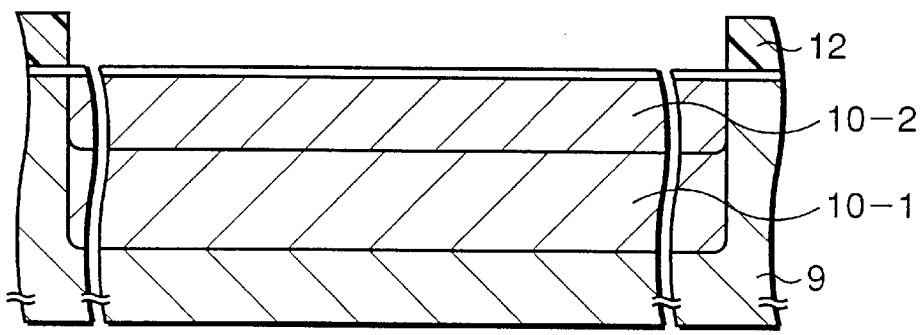
Figure 7C:
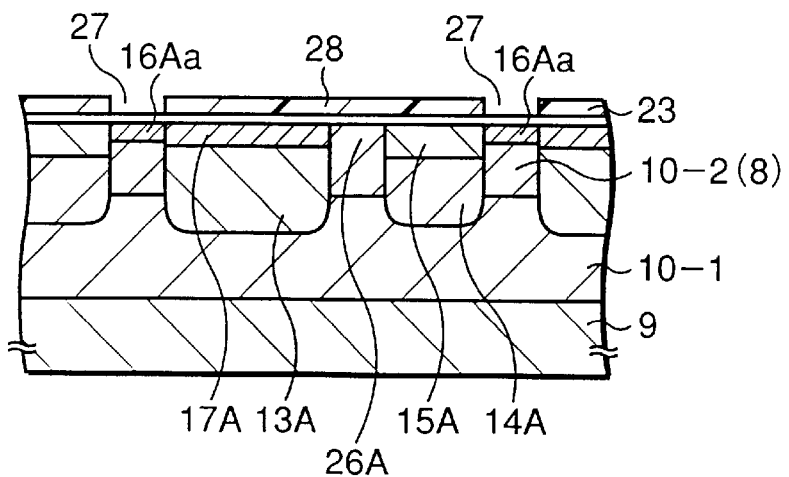

As shown in FIG. 7A, a thin silicon oxide film 11 is formed on a surface of an N-type silicon substrate 9 and, in a state shown in FIG. 7B, boron is ion-implanted at a high energy of 1–2 MeV using as mask a resist film 12 having an opening at least at a portion where an image region is formed. This is for forming a first P-type region 10-1 having an impurity concentration of $5.0 \times 10^{14}$ cm$^{-3}$ to $5.0 \times 10^{15}$ cm$^{-3}$. Then, by using the same mask 12 as used for ion-implantation for the formation of the first P-type region 10-1, boron is implanted at an energy of 100–200 keV followed by activation, thereby forming a second P-type region 10-2 having an impurity concentration of about $2.0 \times 10^{15}$ cm$^{-3}$ to $5.0 \times 10^{16}$ cm$^{-3}$. This compensates the P-type impurity concentration lowered in the vicinity of a surface region as a consequence of the formation of the first P-type region 10-1 at the high energy ion-implantation. In this way, a two layer first well is formed. Next, phosphorus is selectively ion-implanted at a high energy of 400–500 keV and an activation process is carried out whereby, as shown in FIG. 7C, an N-type region 13A (impurity concentration of about $1.0 \times 10^{16}$ cm$^{-3}$ to $1.0 \times 10^{17}$ cm$^{-3}$) of the photodiode is formed, and further a P-type second well 14A and an N-type buried layer 15A are formed by ion-implantation followed by activation, respectively. Then, a boron implantation process is carried out for the control of the threshold of the read-out gate. By doing so, a boron concentration of a surface portion (a threshold control layer—not shown) of the read-out gate 26A becomes about $1.0 \times 10^{16}$ cm$^{-3}$ to $1.0 \times 10^{17}$ cm$^{-3}$. Thereafter, on a portion for forming the element isolation region, a resist film 28 having a thickness of about 1 $\mu$m with an opening 27 having a width of about 0.6 $\mu$m is formed, and a P$^+$-type region 16A$a$ for element isolation having an impurity concentration of about $1.0 \times 10^{17}$ cm$^{-3}$ to $1.0 \times 10^{18}$ cm$^{-3}$ is formed by ion-implantation of boron at an energy of about 20 keV. Next, a gate oxide film 23 is newly formed after the removal of the silicon oxide film 11, and a transfer gate electrode 24, an insulation film (not shown), and a read-out/transfer gate electrode 25 are sequentially formed. Then, a metal shielding film (not shown), a cover film, etc. are formed.

According to the invention, since an ion-implantation process for the element isolation region is carried out before the formation of the photodiode region and the vertical CCD register, no locational precision is required to such ion-implantation process.

Immediately under the read-out gate, boron is ion-implanted for the control of the threshold, and the concentration of this boron is about $1.0 \times 10^{16}$ cm$^{-3}$ to $1.0 \times 10^{17}$ cm$^3$ in the vicinity of the surface (not shown in the drawings). This surface impurity concentration is higher than the peak concentration of the second P-type region shown in FIG. 6B and, since the peak of this second P-type region is located within the substrate and the surface impurity concentration is even further lowered, there is no increase in the threshold voltage because of the provision of the second P-type region.

In the conventional structure, where the N-type region 13A of the photodiode is formed deep for purposes of enhancing sensitivity, the current path to the N-type vertical CCD buried layer from the photodiode inevitably enters inside the substrate and, as a consequence, the read-out cannot be effected unless a high voltage is applied to the read-out/transfer gate electrode.

However, according to the embodiment of the present invention, because of the presence of the P-type region 10-2, the current path is formed towards a surface side, and this allows the read-out without the need for applying a high voltage. Thus, it is possible to enhance sensitivity without an accompanying higher voltage for the read-out.

Also, the fact that the resist film for the sole purpose of forming the element isolation region is only the resist film 28 simplifies the fabrication process. Further, the fact that no minimum dimension limit as needed when a thick resist film is used does not have to be taken into account enables further finer patterning. Furthermore, the problem as explained with reference to FIG. 5B for the shadow to develop during the ion-implantation process is eliminated.

Figure 8A:
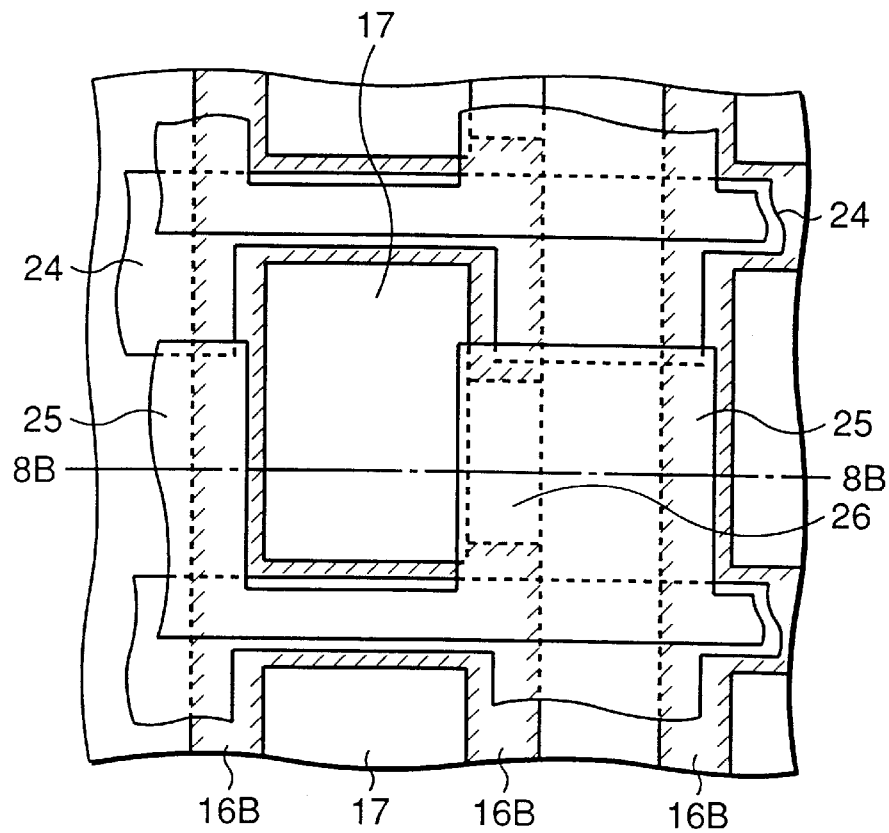
FIG. 8A is a plan view showing a solid-state image sensor of a second embodiment according to the invention (second aspect of the invention)
Figure 8B:
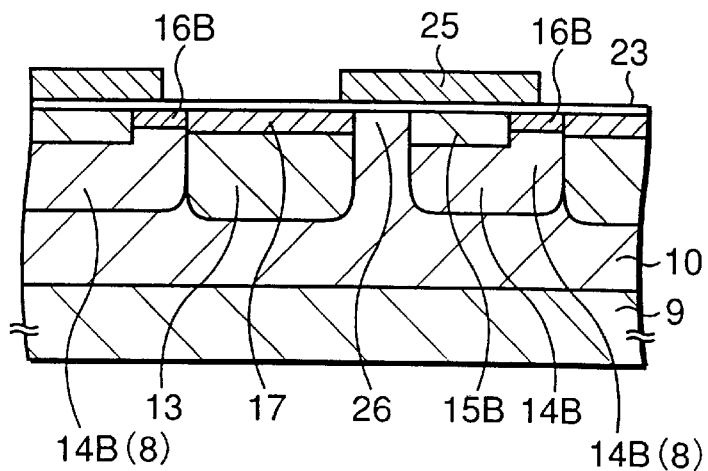
FIG. 8B is a sectional view of the same with the section taken along line 8B—8B in FIG. 8A.

Now, the solid-state image sensor of the second aspect of the invention as a second embodiment is explained with reference to FIGS. 8A and 8B. The solid-state image sensor is composed of a first well and a pixel. The first well is constituted by a P-type region 10 which is disposed on a surface portion of an N-type silicon substrate 9. The pixel includes a photodiode region constituted by a first N-type region 13 which is disposed in the P-type region 10 and a P$^+$-type surface layer 17 which is formed on a surface portion of the N-type region 13; a vertical CCD register which includes a second P-type well 14B which is spaced from but adjacent to the photodiode region and which is formed by the P-type region 10 so as to have an impurity concentration higher than that of the second P-type region 10 and a buried channel layer which is formed on a surface portion of the second well layer 14B so as to have a depth shallower than that of the first N-type region 13; a read-out gate region 26 constituted by the silicon substrate region interposed between the photodiode region and the buried channel layer 15B; and a P-type element isolation region 8 which insulates the first N-type region 13 and the buried channel layer 15B. Further, there is provided a P$^+$-type region 16B which is formed by the P-type element isolation region 8 on a surface of the second well 14B(8).

In the above arrangement, the P-type impurity concentration under the P-type element isolation region becomes high and is effective in suppressing the electron diffusion from the first N-type region which leads to smear, thus reducing the smear. This is because electrons re-combine and are extinguished at the high P-type impurity concentration region.

Figure 9A:
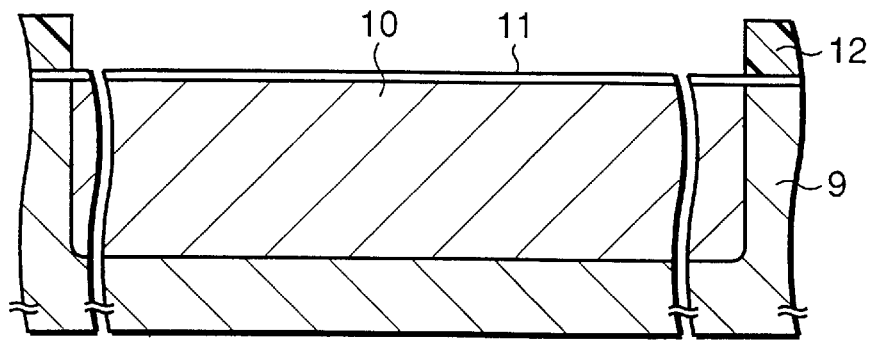
FIGS. 9A–9C are sectional views of the image sensor of the second embodiment for use in explaining sequential steps of a method for fabricating the same according to the invention.
Figure 9B:
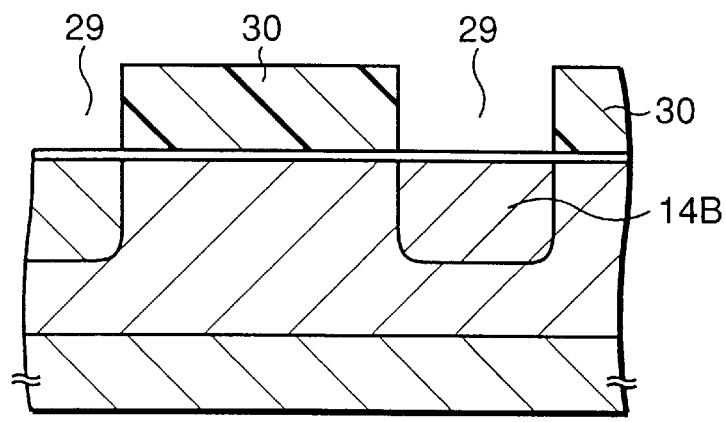
Figure 9C:
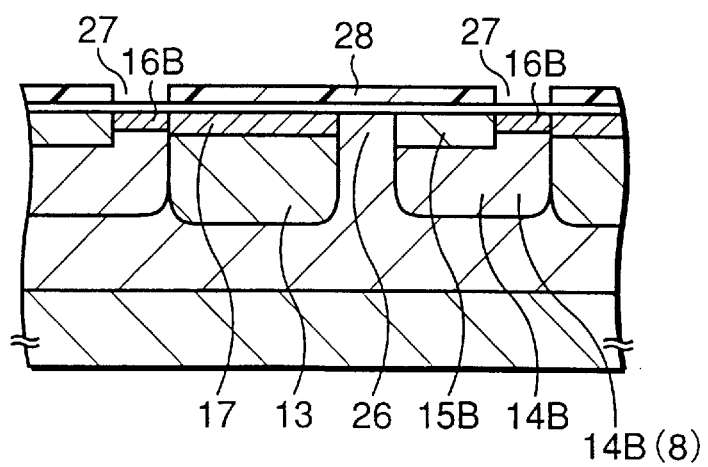

As shown in FIG. 9A, a thin silicon oxide film 11 is formed on a surface of an N-type silicon substrate 9 and boron is ion-implanted at a high energy of 1–2 keV using as mask a resist film 12 having an opening at least at a portion where an image region is formed, and an activation process is carried out. Thus, a first well 10 having an impurity concentration of $5.0 \times 10^{14}$ cm$^{-3}$ to $5.0 \times 10^{15}$ cm$^{-3}$ is formed. Then, as shown in FIG. 9B, a resist film 30 having an opening 29 is formed on a vertical CCD register buried channel layer formation region and a portion for forming an element isolation region. By using this resist film 30 as a mask, boron is implanted at an energy of 150–500 keV and an activation process is carried out, thereby forming a second well 14B having an impurity concentration of about $5.0 \times 10^{15}$ cm$^{-3}$ to $1.0 \times 10^{17}$ cm$^{-3}$. After the removal of the resist film 30, phosphorus is ion-implanted at a high energy of 400–500 keV using a mask not shown, and an activation process is carried out, whereby a first N-type region 13 having an impurity concentration of about $1.0 \times 10^{16}$ cm$^{-3}$ to $1.0 \times 10^{17}$ cm$^{-3}$ is formed. Further, by carrying out ion-implantation and activation processes, an N-type buried layer 15B is formed and, in the same way as in the first embodiment, a threshold control layer (not shown) for controlling a threshold value of the read-out gate is formed. Then, as shown in FIG. 9C, on a portion for forming the element isolation region, a resist film 28 having a thickness of about 1 μm with an opening 27 having a width of about 0.6 μm is formed, and a P$^+$-type region 16B having an impurity concentration of about $1.0 \times 10^{17}$ cm$^{-3}$ to $1.0 \times 10^{18}$ cm$^{-3}$ is formed by ion-implantation of boron at an energy of about 20 kev followed by activation. Thereafter, a gate insulating film 23, a transfer gate electrode 24, a read-out/transfer gate electrode 25, etc. are formed.

Figure 1A:
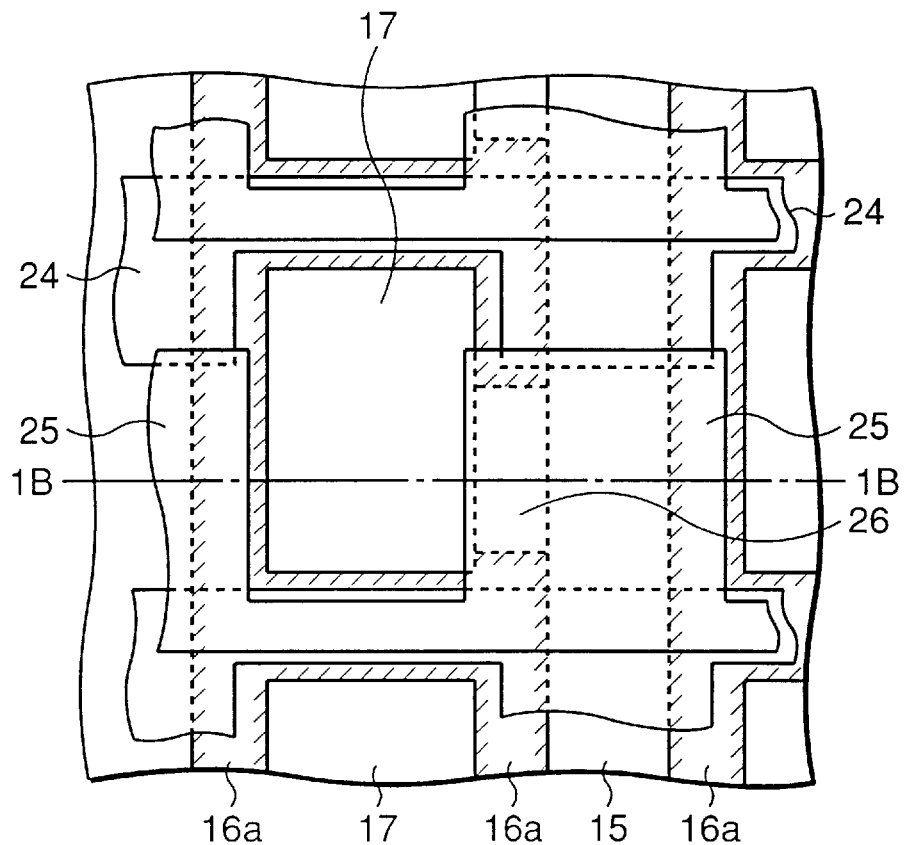
FIG. 1A is a plan view showing a conventional solid-state image sensor.
Figure 1B:
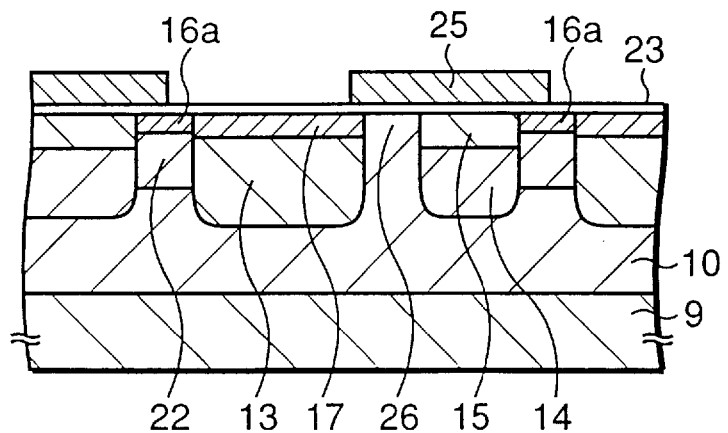
FIG. 1B is a sectional view of the same with the section taken along line 1B—1B in FIG. 1A.
Figure 2A:
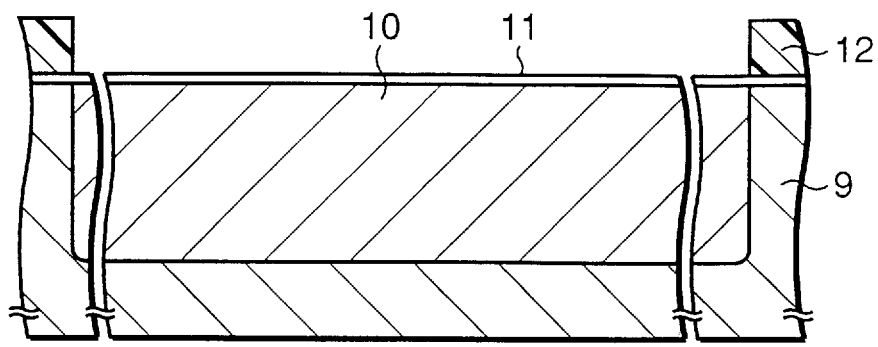
FIGS. 2A–2C are sectional views of an image sensor for use in explaining sequential steps of a conventional method for fabricating the same.
Figure 2B:
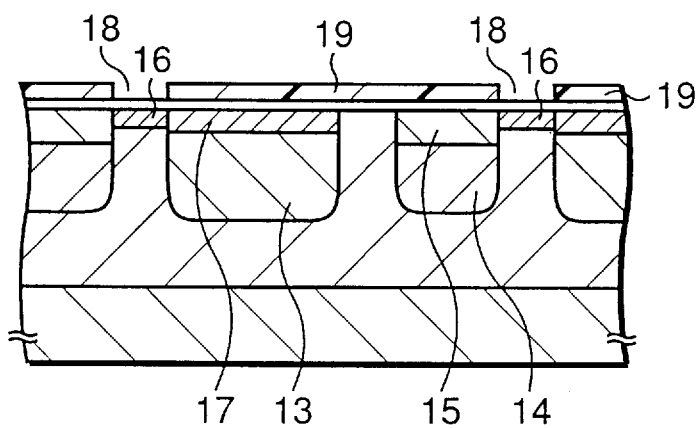
Figure 2C:
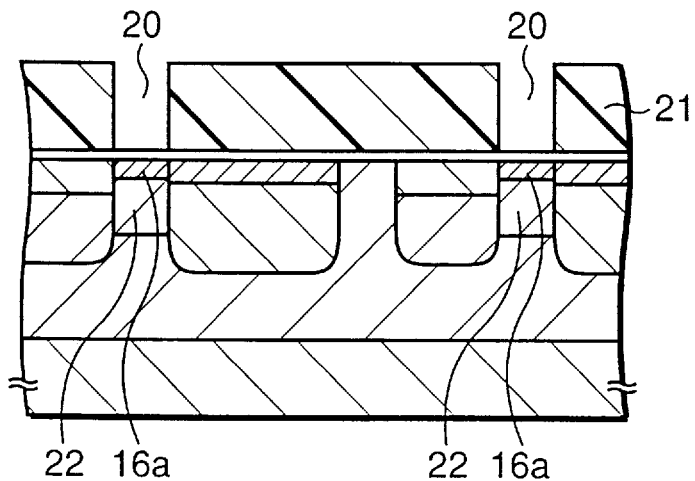
Figure 3:
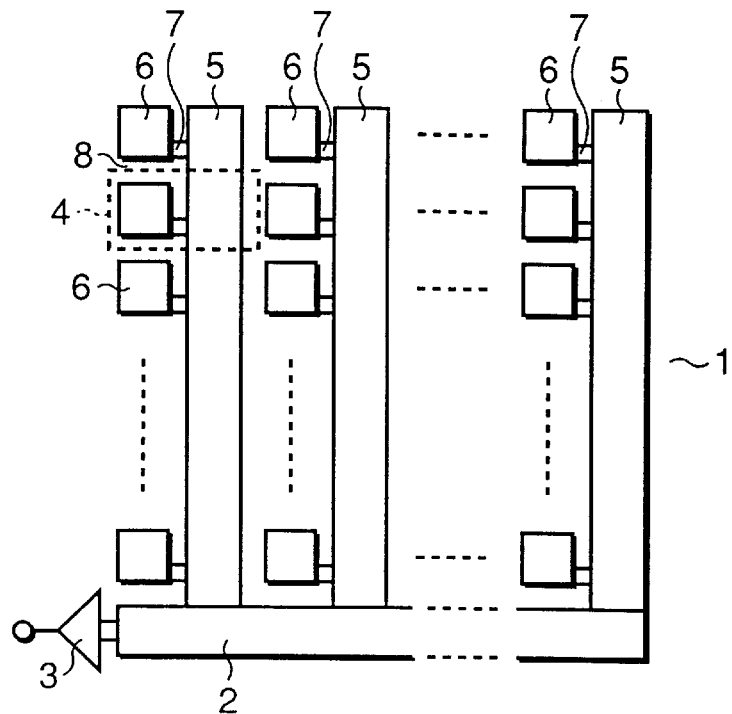
FIG. 3 is a block diagram showing a general structure of a conventional interline type CCD image sensor.
Figure 4:
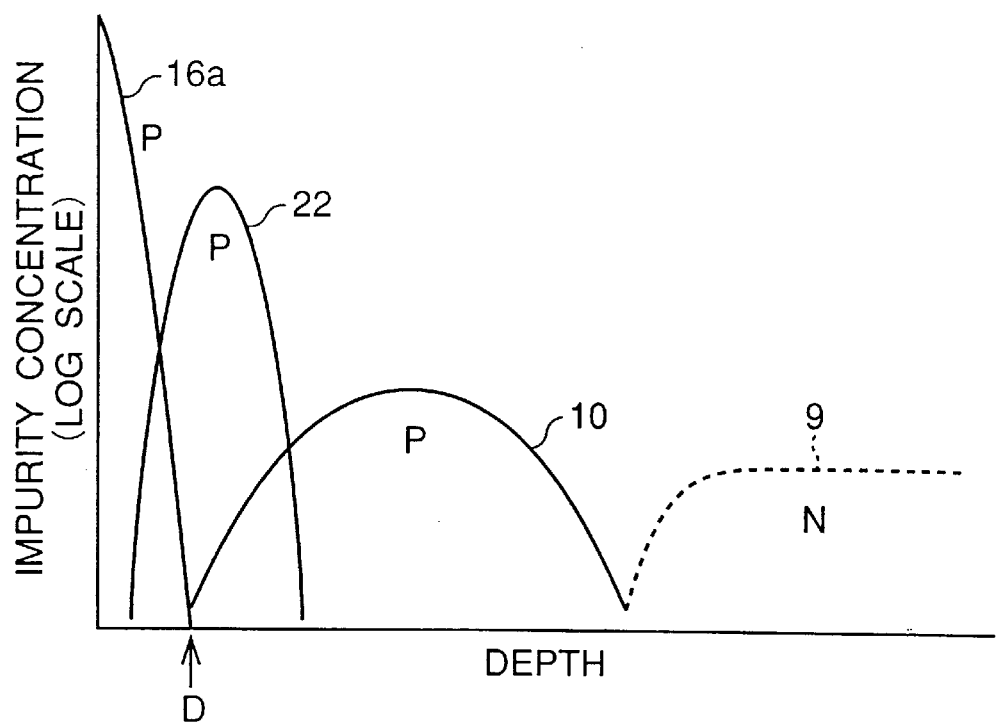
FIG. 4 is a graph showing a first-order impurity concentration distribution in the depth direction of the substrate at the element isolation region in a conventional solid-state image sensor.
Figure 5A:
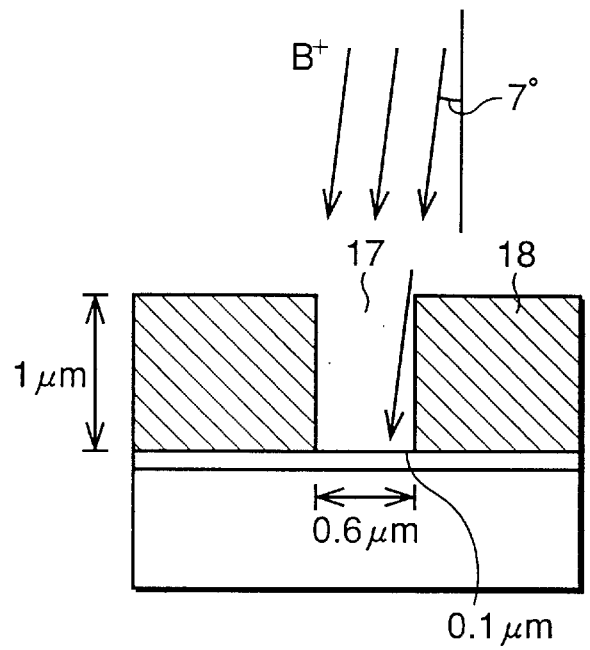
FIGS. 5A and 5B are diagrams for use in explaining problems encountered in the prior art when a thick resist film is used during an ion-implantation process.
Figure 5B:
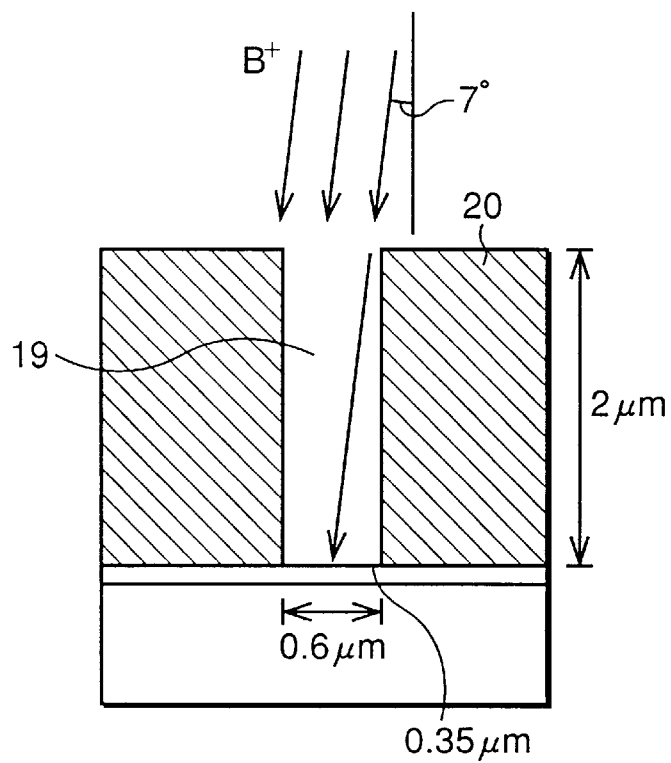

The lower portion of the element isolation and the second well 14B under the vertical CCD register buried layer 15B are formed simultaneously, the problem as explained with reference to FIG. 5B for the shadow caused by a thick film during the ion-implantation process is eliminated. That is, in the prior art, as the impurity concentration of the P-type region 22 becomes lower at the side of the buried channel layer 15, the smear occurs because the electrons from the N-type region of the photodiode of the adjacent pixel is diffused and enters into the vertical register. However, the occurrence of the smear is reduced in this embodiment according to the invention.

Figure 10:
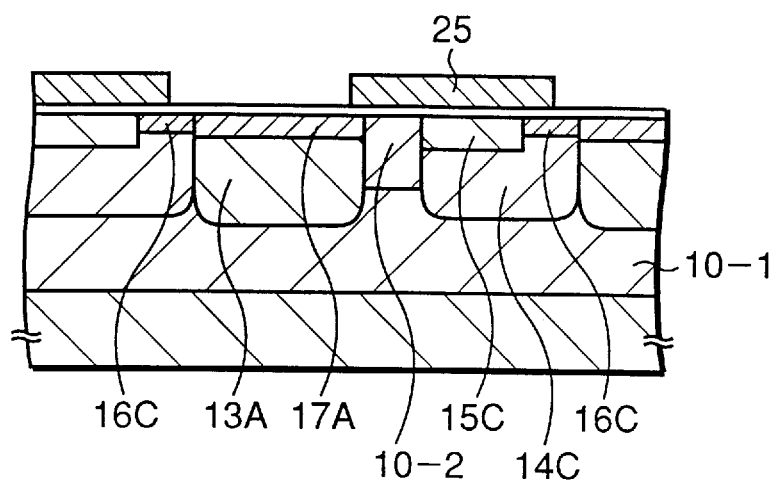
FIG. 10 is a sectional view of an image sensor of a third embodiment according to the invention, in which the feature of the first embodiment and that of the second embodiment are combined.

FIG. 10 shows a solid-state image sensor of a third embodiment according to the invention, in which the feature of the first embodiment and that of the second embodiment are combined.

In this third embodiment, the first well is constituted by the first P-type region 10-1 and the second P-type region 10-2 while the element isolation region is constituted by a P$^+$-type region 16C and a second well 14C. Thus, this embodiment shares the advantages of both the first and the second embodiment. That is, the sensitivity can be enhanced without raising a read-out voltage and the occurrence of smear is reduced.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a solid-state image sensor having a photodiode region, a vertical CCD register for transferring a charge received at said photodiode region, a read-out gate region for reading said charge out to said vertical CCD register, and an element isolation region for isolating said photodiode region and said vertical CCD register, said element isolation region having a high impurity concentration layer and a low impurity concentration layer, said method comprising the sequential steps of:

forming said low impurity concentration layer for said element isolation region by an ion-implantation process;

forming said photodiode region and said vertical CCD register after said ion-implantation process; and forming said high impurity concentration layer of said element isolation region on said low impurity concentration layer.

2. A method for fabricating a solid-state image sensor comprising the steps of:

forming selectively, in a surface side of a first-conductivity type semiconductor substrate, a first well constituted by two layers, one layer being formed from a first second-conductivity type region utilizing first ion-implantation and the other layer being formed from a second second-conductivity type region utilizing second ion-implantation, said second second-conductivity type region having an impurity concentration higher than that of said first second-conductivity type region;

forming a photodiode region by selectively forming, in said second second-conductivity type region, a first first-conductivity type region having a depth deeper than said second second-conductivity type region, and a second-conductivity type surface layer in said first first-conductivity type region;

forming a buried channel layer of a vertical CCD register which has a depth shallower than that of said first first-conductivity type region by selectively forming in said second second-conductivity type region a second second-conductivity type well which has a depth deeper than an impurity concentration higher than that of said second second-conductivity type region, and forming, in a surface portion of said second second-conductivity type well, a second first-conductivity type region; and forming an element isolation region by forming a second-conductivity type region on a surface portion of said second second-conductivity type region, with exception of said photodiode, said buried channel layer and a portion of said second second-conductivity type region interposed therebetween, utilizing third ion-implantation.

3. A method for fabricating a solid-state image sensor comprising the steps of:

forming as a first well of a second-conductivity type region selectively in a surface of a first-conductivity type semiconductor substrate using first ion-implantation;

forming a photodiode region by selectively forming, in said second-conductivity type region, a first first-conductivity type region and a second-conductivity type surface layer formed on said first first-conductivity type region;

forming a second second-conductivity type well and a buried channel layer of a vertical CCD register, said second second-conductivity type well being selectively formed in said second-conductivity type region and having an impurity concentration higher than that of said second-conductivity type region, and said buried channel layer being formed in a surface portion of said second second-conductivity type well and having a depth shallower than that of said first first-conductivity type region; and forming an element isolation region by forming a high impurity concentration second-conductivity type region in a surface portion of said second second-conductivity type well, with exception of said photodiode region, said buried channel layer and a portion of said second second-conductivity type region interposed therebetween, using third ion-implantation.

* * * * *